(12) United States Patent
Bhatia et al.

(10) Patent No.: US 10,348,335 B2
(45) Date of Patent: Jul. 9, 2019

(54) MISCORRECTION AVOIDANCE FOR TURBO PRODUCT CODES

(71) Applicant: SK hynix Inc., Gyeonggi-do OT (KR)

(72) Inventors: Aman Bhatia, San Jose, CA (US); Naveen Kumar, San Jose, CA (US); Yi-Min Lin, San Jose, CA (US); Lingqi Zeng, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/156,088

(22) Filed: May 16, 2016

(65) Prior Publication Data

US 2016/0336969 A1 Nov. 17, 2016

Related U.S. Application Data

(60) Provisional application No. 62/162,511, filed on May 15, 2015.

(51) Int. Cl.
*G06F 11/10* (2006.01)
*H03M 13/00* (2006.01)
*H03M 13/15* (2006.01)
*H03M 13/29* (2006.01)

(52) U.S. Cl.
CPC ..... *H03M 13/2963* (2013.01); *G06F 11/1012* (2013.01); *H03M 13/2912* (2013.01); *H03M 13/2921* (2013.01); *H03M 13/618* (2013.01); *H03M 13/152* (2013.01)

(58) Field of Classification Search
CPC ......... H03M 13/6362; H03M 13/1102; H03M 13/116; H03M 13/1185; H03M 13/1188; H03M 13/618; H03M 13/6356

USPC ........................................................ 714/779
See application file for complete search history.

(56) References Cited

U.S. PATENT DOCUMENTS

| | | | |
|---|---|---|---|
| 7,747,934 B2* | 6/2010 | Livshitz | H03M 13/1111 714/800 |
| 8,015,472 B1* | 9/2011 | Corbett | G06F 11/1076 714/770 |
| 8,060,805 B2* | 11/2011 | Kyung | H03M 13/11 714/752 |
| 8,065,598 B1* | 11/2011 | Gunnam | H03M 13/116 714/800 |
| 8,762,818 B1* | 6/2014 | Sun | H03M 13/1525 714/781 |
| 9,559,727 B1 | 1/2017 | Kumar et al. | |
| 2007/0011567 A1* | 1/2007 | Choi | H03M 13/116 714/758 |
| 2007/0101243 A1* | 5/2007 | Kim | H03M 13/1102 714/790 |
| 2009/0158115 A1* | 6/2009 | Bae | H03M 13/1102 714/752 |
| 2009/0217130 A1* | 8/2009 | Myung | H03M 13/1165 714/752 |
| 2011/0119568 A1* | 5/2011 | Jeong | H03M 13/1185 714/790 |

(Continued)

*Primary Examiner* — James C Kerveros
(74) *Attorney, Agent, or Firm* — IP & T Group LLP

(57) ABSTRACT

Systems may include a memory storage suitable for storing data, an encoder suitable for encoding data into codewords arranged in an array of a number of rows and a number of columns, and a decoder suitable for receiving the encoded codewords, decoding the encoded codewords, and detecting miscorrections in the decoding.

20 Claims, 10 Drawing Sheets

(56) References Cited

U.S. PATENT DOCUMENTS

| | | | |
|---|---|---|---|
| 2011/0276855 A1* | 11/2011 | Jeong | H03M 13/033 714/752 |
| 2012/0089891 A1* | 4/2012 | Miyazaki | H03M 13/6356 714/790 |
| 2015/0309869 A1 | 10/2015 | Mittelholzer et al. | |
| 2016/0342467 A1 | 11/2016 | Kumar et al. | |

* cited by examiner

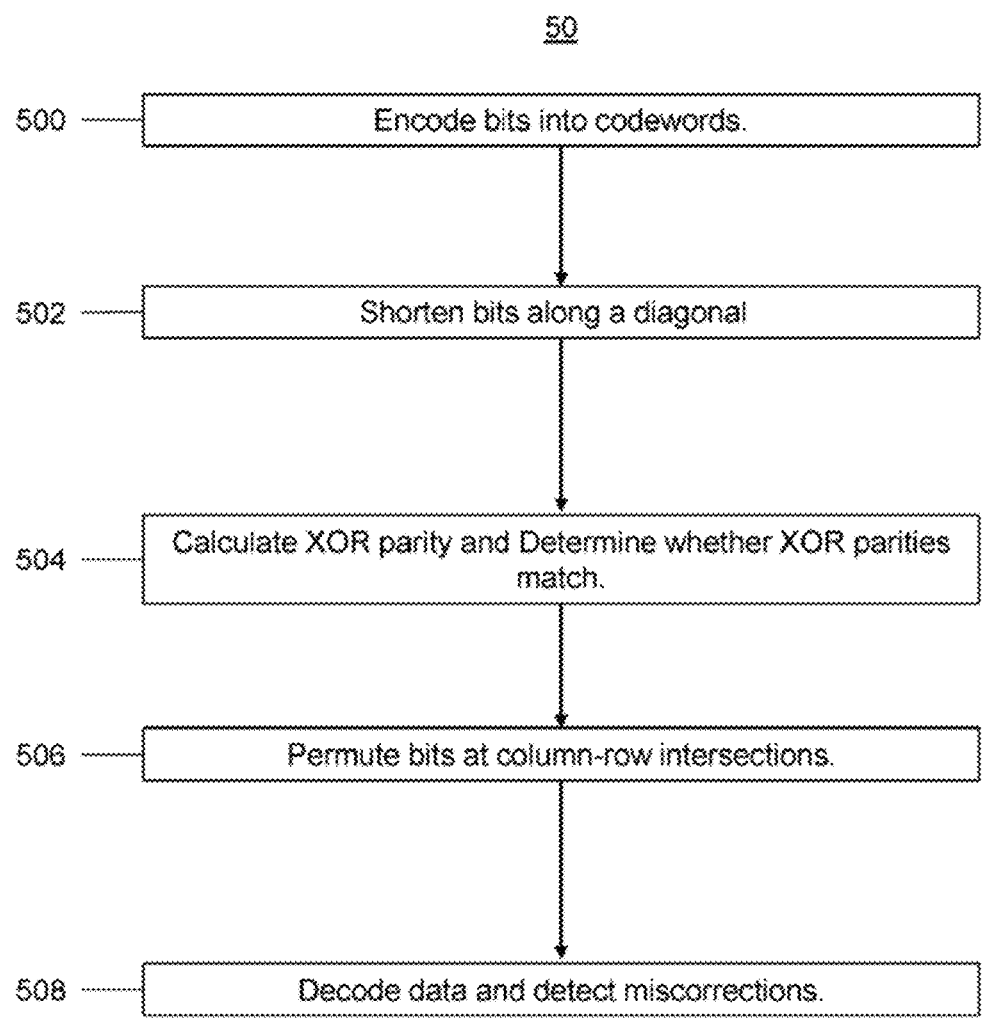

| | Col Code 1 Info. Bits | Col Code 2 Info. Bits | Col Code 3 Info. Bits | | | |
|---|---|---|---|---|---|---|
| Row Code 1 Info. Bits | b0 b1 b2 | b3 b4 b5 | b6 b7 b8 | r0 r1 r2 | Row Code 1 Parity Bits |
| Row Code 2 Info. Bits | b9 b10 b11 | b12 b13 b14 | b15 b16 b17 | r3 r4 r5 | Row Code 2 Parity Bits |
| Row Code 3 Info. Bits | b18 b19 b20 | b21 b22 b23 | b24 b25 b26 | r6 r7 r8 | Row Code 3 Parity Bits |

| c0 c1 c2 | c3 c4 c5 | c6 c7 c8 |
|---|---|---|
| Col Code 1 Parity Bits | Col Code 2 Parity Bits | Col Code 3 Parity Bits |

| Information Bits | Parity Bits |
|---|---|
| b0 b1 b2 b3 b4 b5 b6 b7 b8 | r0 r1 r2 |
| b9 b10 b11 b12 b13 b14 b15 b16 b17 | r3 r4 r5 |
| b18 b19 b20 b21 b22 b23 b24 b25 b26 | r6 r7 r8 |
| b0 b9 b18 b1 b10 b19 b2 b11 b20 | c0 c1 c2 |
| b3 b12 b21 b4 b13 b22 b5 b14 b23 | c3 c4 c5 |
| b6 b15 b24 b7 b16 b25 b8 b17 b26 | c6 c7 c8 |

80

| Information Bits | Parity Bits |
|---|---|

| b0 b1 b2 | b3 b4 b5 | b6 b7 b8 | r0 r1 r2 |
| b9 b10 b11 | b12 b13 b14 | b15 b16 b17 | r3 r4 r5 |
| b18 b19 b20 | b21 b22 b23 | b24 b25 b26 | r6 r7 r8 |
| b0 b1 b2 | b9 b10 b11 | b18 b19 b20 | c0 c1 c2 |
| b3 b4 b5 | b12 b13 b14 | b21 b22 b23 | c3 c4 c5 |
| b6 b7 b8 | b15 b16 b17 | b24 b25 b26 | c6 c7 c8 |

| b0 | b1 | b2 | b3 | b4 | b5 | b6 | b7 | b8 |
|----|----|----|----|----|----|----|----|----|
| b9 | b10| b11| b12| b13| b14| b15| b16| b17|
| b18| b19| b20| b21| b22| b23| x1 | x2 | x3 |

| r0 | r1 | r2 |
|----|----|----|
| r3 | r4 | r5 |
| r6 | r7 | r8 |

| c0 | c1 | c2 | c3 | c4 | c5 | c6 | c7 | c8 |
|----|----|----|----|----|----|----|----|----|

| Information Bits | | | | | | | | | Parity Bits | | |
|---|---|---|---|---|---|---|---|---|---|---|---|
| b0 | b1 | b2 | b3 | b4 | b5 | b6 | b7 | b8 | r0 | r1 | r2 |
| b9 | b10 | b11 | b12 | b13 | b14 | b15 | b16 | b17 | r3 | r4 | r5 |
| b18 | b19 | b20 | b21 | b22 | b23 | b24 | b25 | b26 | r6 | r7 | r8 |
| b2 | b1 | b0 | b11 | b10 | b9 | b20 | b19 | b18 | c0 | c1 | c2 |
| b5 | b4 | b3 | b14 | b13 | b12 | b23 | b22 | b21 | c3 | c4 | c5 |
| b8 | b7 | b6 | b17 | b16 | b15 | b26 | b25 | b24 | c6 | c7 | c8 |

US 10,348,335 B2

MISCORRECTION AVOIDANCE FOR TURBO PRODUCT CODES

CROSS-REFERENCE TO RELATED APPLICATIONS

This application claims the benefit of U.S. Provisional Application No. 62/162,511 filed May 15, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Aspects of the invention include systems. The systems may include a memory storage suitable for storing data, an encoder suitable for encoding data into codewords arranged in an array of a number of rows and a number of columns, and a decoder suitable for receiving the encoded codewords, decoding the encoded codewords, and detecting miscorrections in the decoding.

Further aspects of the invention include memory devices. The devices may include an encoder configured to encode data into codewords arranged in an array of a number of rows and a number of columns, and a decoder configured to receive the encoded codewords, decode the encoded codewords, and detect miscorrections in the decoding.

Additional aspects of the invention include methods. The methods may include encoding, with an encoder, data into codewords arranged in an array of a number of rows and a number of columns, receiving, with a decoder, the encoded codewords, decoding, with the decoder, the received codewords, and detecting, with the decoder, miscorrections in the decoding.

BRIEF DESCRIPTION OF THE DRAWINGS

FIG. 5 is a flowchart of steps in methods for encoding and decoding in accordance with aspects of the invention.

FIGS. 6, 7, 8, 9, 10, 11, 12, 13, 14, and 15 are diagrams of example arrays of bits according to aspects of the invention.

DETAILED DESCRIPTION

Figure 1:
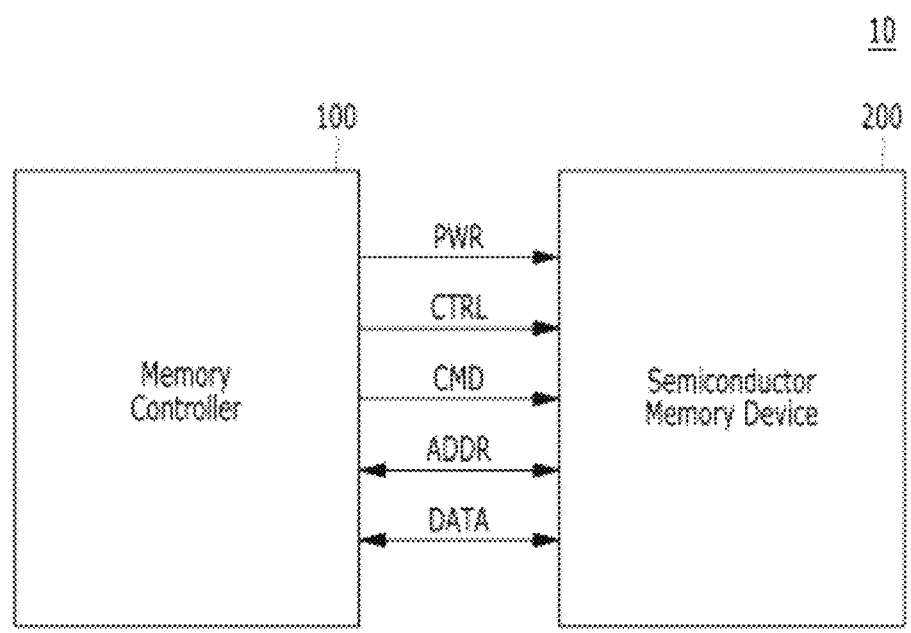
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines.

The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
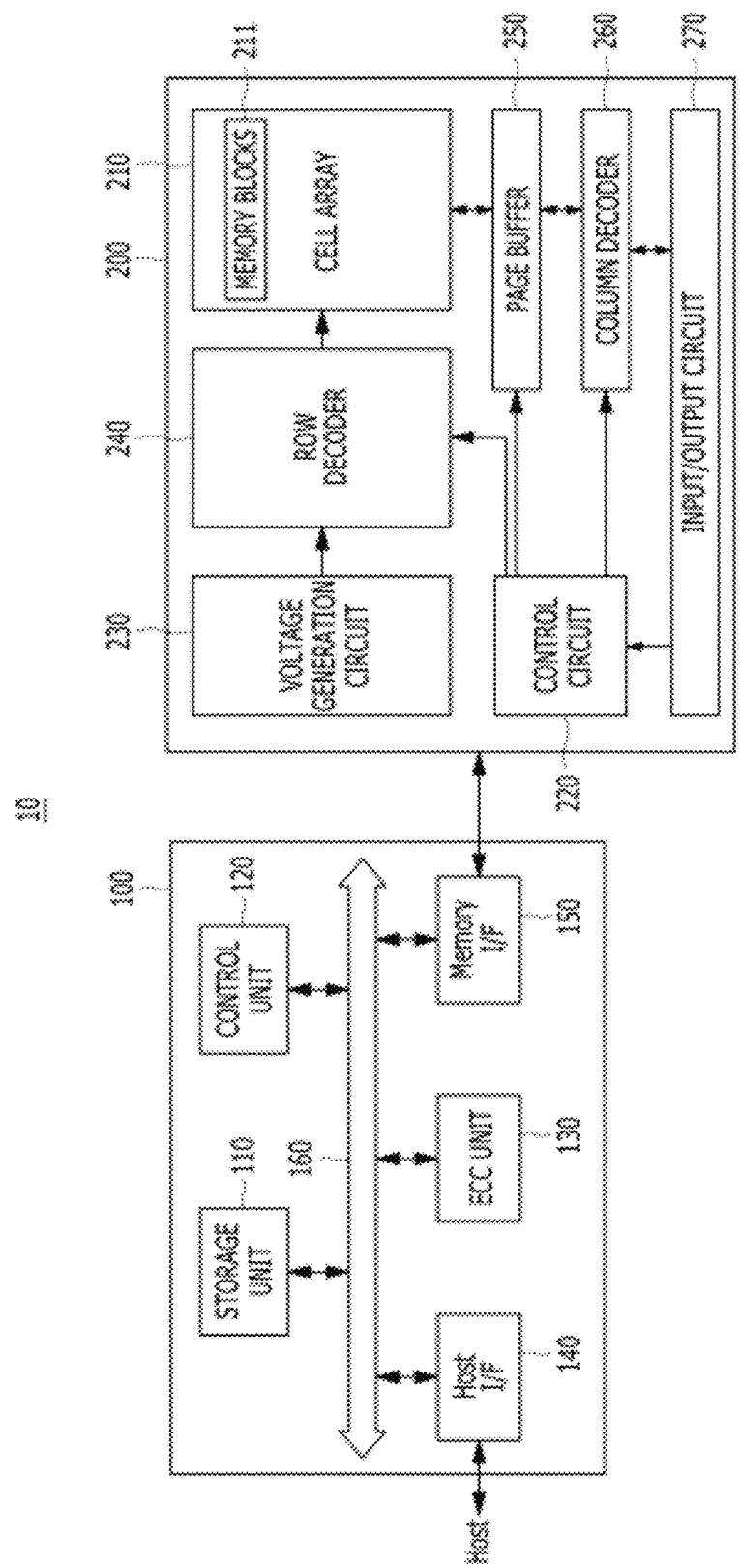
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
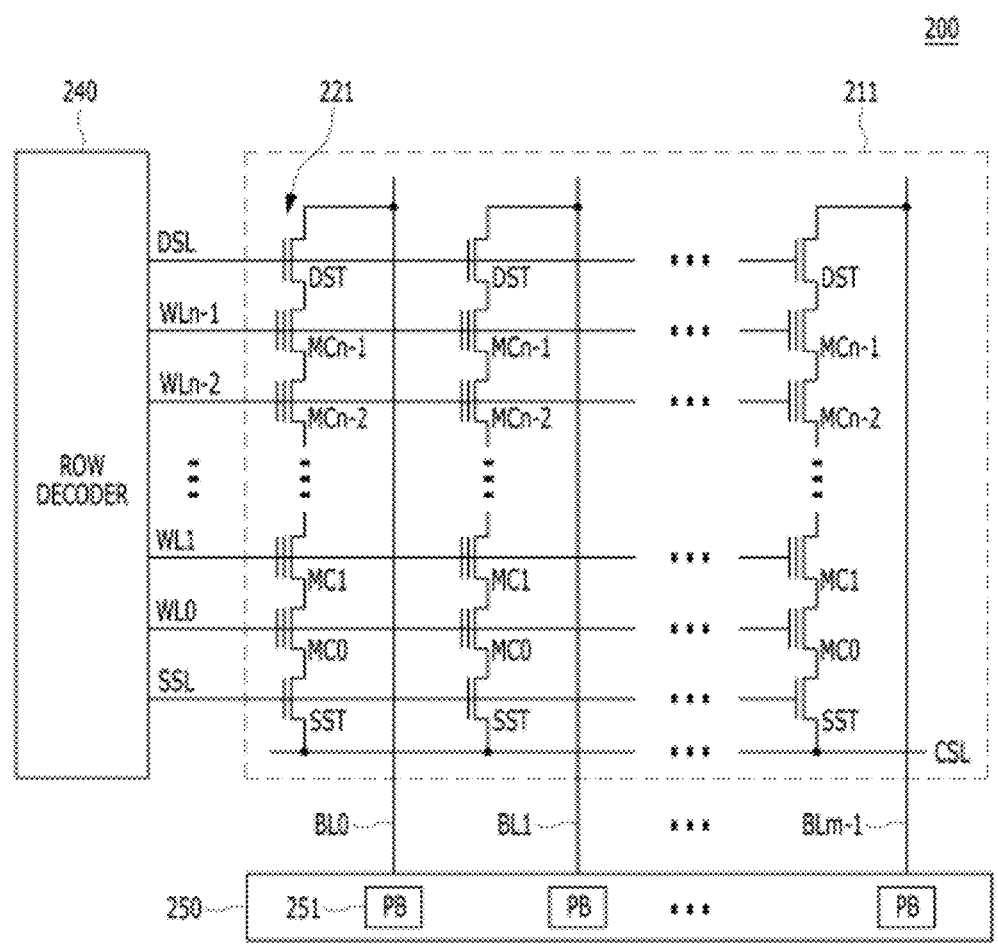
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

For NAND flash storage, it is desirable to have a SoC solution which has a small silicon area leading to reduced cost. Proposed codes may be designed for 4 KB code length and performance may be optimized to minimize the hardware complexity for system on chip (SoC). A turbo product codes (TPC) structure is an example in which data is arranged in a rectangular block (e.g., an array) and row parities are generated for bits in each row, followed by combining several columns to generate column parities. The bits may be interleaved such that the columns of the rectangular block are read sequentially to generate column codewords. However, the hardware implementation for this interleaving is complicated and requires more hardware area. A hardware-friendly interleaving is adopted in which the first column codeword is constructed by reading bits in a following order, N bits from $1^{st}$ row, N bits from $2^{nd}$ row and so on till N bits from the last row (N being a number of columns combined to form each column codeword). This interleaving is easier to implement on the hardware. However, this interleaving introduces a miscorrection issue.

Thus, aspects of the invention are directed to addressing miscorrection issues in decoding of codewords. Disclosed herein are several examples that address this miscorrection issue. While the examples disclosed herein utilize a BCH code, the invention is not limited to such, and those of skill in the art will understand other suitable codes that may be utilized in order to effectuate the invention.

Figure 4:
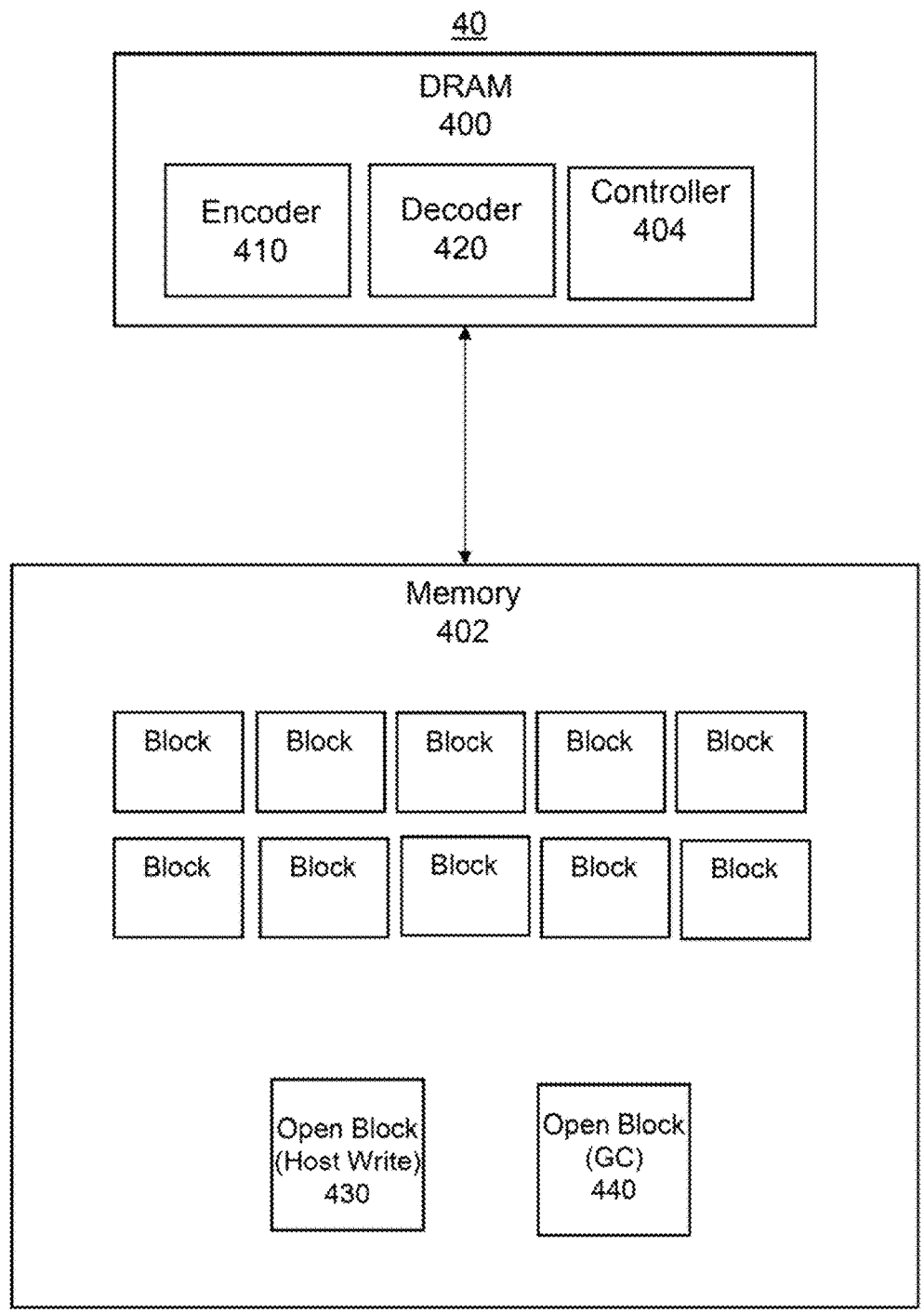
FIG. 4 is a diagram of a system for encoding and decoding according to aspects of the invention.

At FIG. 4, an example system 40 for encoding and decoding is shown. The system 40 includes a memory 402 and a DRAM 400. The memory 402 may include a plurality of blocks (e.g., data), and open blocks for host write 430 and garbage collection 440. The DRAM 400 may include a controller 404, an encoder 410, and a decoder 420, with the DRAM 400 being in communication with the memory 402. The encoder 410 may be configured to encode data bits into codewords and perform other various functions as is described below. The decoder 420 may be configured to decode data from the encoder 410, detect miscorrection issues, and other functions as is described below. Although shown as separate units, the encoder 410 and decoder 420 may form a single unit, may be integrated with the controller 404, and/or have other arrangement as is known to those of skill in the art.

FIG. 5 is a flowchart 50 of steps for encoding and decoding. Although steps 500-508 are shown, these steps represent examples used for miscorrection detection. The steps may be performed in any order, and not all steps are required to effectuate the invention. For example, step 502 may be taken and steps 504 and 506 may be omitted, etc.

FIGS. 6-15 are examples of arrays of codewords in accordance with aspects of the invention.

At step 500, bits are encoded into codewords. The bits may be encoded by an encoder (e.g., encoder 410). In FIG. 6, a parallel concatenated construction (rectangular array 60) of TPC is shown. In this example, the number of columns (N) combined is taken 3 for simplicity. A column codeword is constructed by reading the bits of the rectangular block column-wise as shown in the array 70 of FIG. 7. As an example, the first column codeword data is given as (b0, b9, b18, b1, b10, b19, b2, b11, b20). This interleaving requires more hardware because the data is stored according to rows in memory and each bit needs to be read through separate read operations.

As discussed above, there is a hardware-friendly interleaving which can be implemented with lower complexity. An example of this interleaving is shown in the array 80 of FIG. 8, where the information bits for the first column codeword are given as (b0, b1, b2, b9, b10, b11, b8, b9, b20). In general, for this hardware-friendly construction, N bits can be read in parallel from the memory such that all N bits belong to the same row codeword and same column codeword (e.g., referred to these N bits herein as belonging to a row-column intersection). Moreover, any error corrections in a row-column intersection can be easily implemented for both row decoding and column decoding. This interleaving has lower hardware requirements but introduces low-weight codewords as explained below.

Consider the row-column intersections belonging to the diagonal of the rectangular arrays 60, 70, 80. For the bits in these intersections, the location inside row and column codewords to which they belong is the same. For example, it can be seen in FIG. 8 that the bits b0, b1, and b2 are the first three bits of the first row codeword as well as the first column codeword when the hardware-friendly interleaving is used. Therefore, a low-weight codeword may be formed by choosing only a few bits belonging to one diagonal block to be non-zero. The introduction of these low-weight codewords causes a miscorrection problem.

Figures 8, 9:
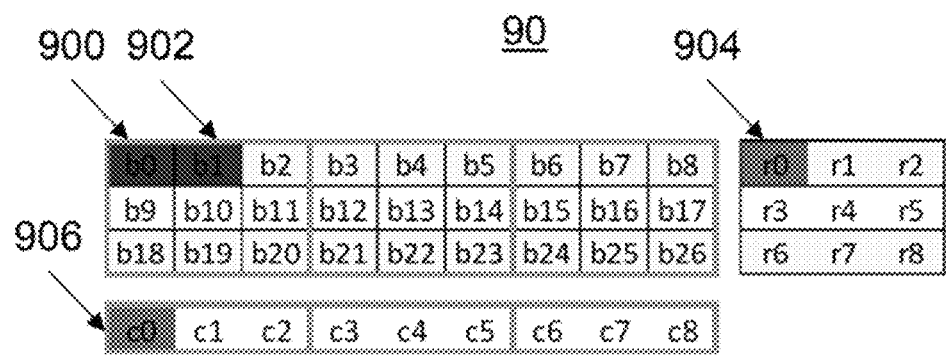
Figures 10, 11:
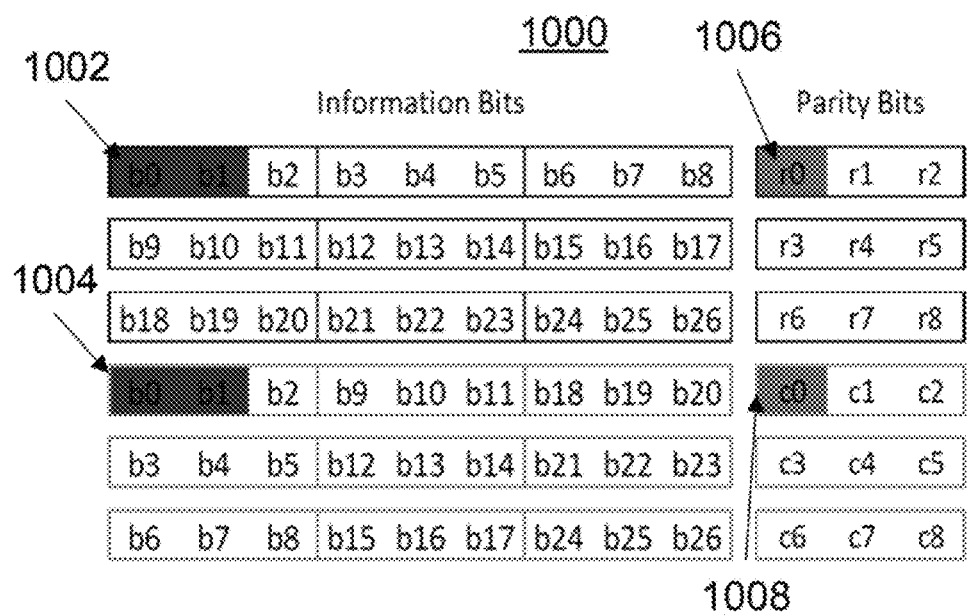

In FIG. 9, an example array 90 is shown in which the first row and first column miscorrect to the same codeword simultaneously (shown by b0 900, b1 902, r0 904, and c0 906). The bits 900 and 902 represent errors introduced by the channel. The bits 904 and 906 represent changes made by the decoder such that the first row and the first column have both miscorrected to the same codeword as shown in FIG. 10. The correction capability is assumed to be equal to 1. FIG. 10 shows an array 1000 in an example of how the first row and column codewords are miscorrecting to the same codeword. The first row and first column codewords miscorrect to the same codeword due to the two channel errors in FIG. 9 (represented by bits 1002 and bits 1004). Miscorrections on the row and column codewords introduce errors in the parity bits (represented by bit 1006 and bit 1008). The decoder declares the data successfully decoded. This problem does not occur in the original interleaving scheme where bit b1 belongs to different location inside the row and column codewords and there is high probability that either decoder has decoding failure rather than miscorrection.

Thus, the miscorrection problem needs to be addressed, and can be done according to the following methods, systems, and devices disclosed herein.

Figure 12:
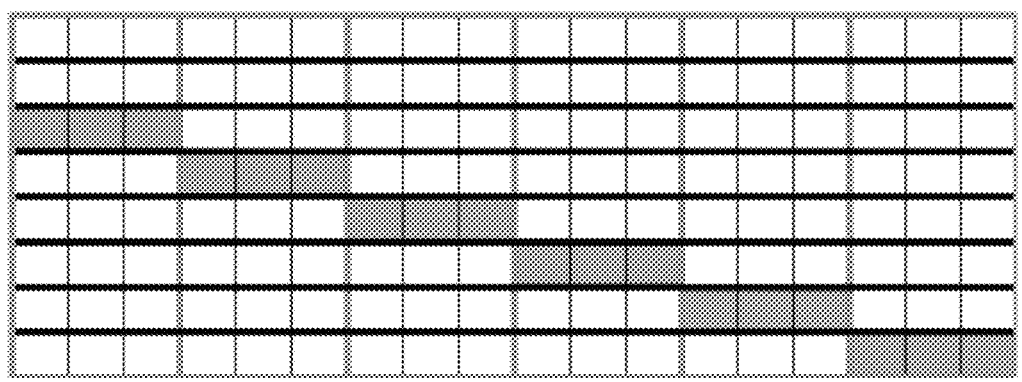
Figure 13:
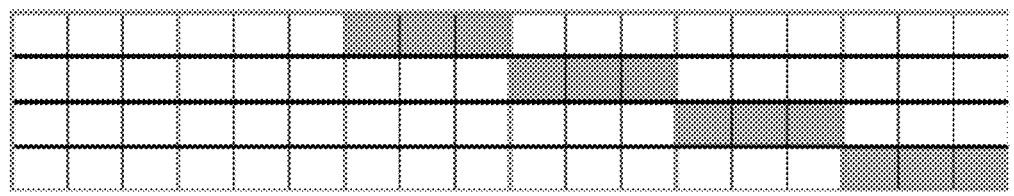

At step 502, bits along a diagonal of an array of codewords may be shortened. Referring to FIG. 11, if the bits on the diagonal of the rectangular array 1100 are shortened by putting zero-padding in these locations, the low-weight codewords that cause miscorrection are eliminated and the miscorrection problem is easily solved. The shortening may be performed by the encoder (prior to or after encoding) and/or by the decoder. It should be noted that this miscorrections will happen on the diagonal blocks which have same distance from the row and column parities. In FIG. 12, shortening on diagonal blocks in the array 1200 is shown for the case where number of row codewords is greater than number of column codewords. In FIG. 13, shortening on diagonal blocks in the array 1300 is shown for the case where number of column codewords is greater than number of row codewords.

Some extra hardware logic may be required in the decoder to handle the shortened positions. Also, while the diagonal-shortening scheme eliminates low-weight codewords that have only one non-zero row-column intersection block, there are other low-weight codewords (of comparatively higher weight) that have non-zero intersections at off-diagonal positions in the rectangular array. Finally, if the number of user data bits is kept the same, shortening leads to an increase in the number of rows and columns codewords, or the number of information bits in each constituent codeword, which leads to a decrease in the waterfall performance of the TPC.

At step 504, XOR parities may be calculated and matches are determined with the XOR parities. Referring to the array 1400 of FIG. 14, an N-bit XOR parity for the user data bits may be computed and stored (e.g., stored in a portion of the array 1400, as represented by x1, x2, x3) during the encoding process (e.g., by the encoder) and the validity of the data bits may be confirmed by verifying that the XOR-parity of the decoded data matches the stored XOR-parity (e.g., by the decoder). Thus, the encoder may generate XOR parity based on the codewords and the decoder may generate an XOR parity based on the codewords. The XOR-parity bits may be computed by taking the bitwise XOR of each of the N positions in all row-column intersections in the rectangular array except one. Taking the example array 60 of FIG. 6, a 3-bit XOR may be calculated as follows:

$$x1 = b0 + b3 + b6 + b9 + \ldots + b21$$

$$x2 = b1 + b4 + b7 + b0 + \ldots + b22$$

$$x3 = b2 + b5 + b8 + b11 + \ldots + b23$$

This N-bit XOR parity may be stored in the last row-column intersection (e.g., where x1, x2, and x3 are located in array 1400 versus where b24, b25, and b26 are located in array 60).

The XOR-parity may be computed during encoding and decoding processes and requires little extra hardware. The rate of the code is slightly lower by this step. This rate loss may be reduced by computing a P-bit CRC of the N-bit XOR-parities and storing the P (where P<N) parity bits of the CRC rather than the XOR-parities. Finally, this step is able to detect miscorrection occurrences but it is not able to correct them. After detection, standard correction processes may be used to correct the remaining error pattern of low-weight.

Thus, the process of step 504 is guaranteed to eliminate all miscorrections with one non-zero row-column intersection, regardless of whether this intersection is on the diagonal or off-diagonal position in the rectangular array. This method can also detect other miscorrections with more than one non-zero row-column intersection with a very high probability.

At step 506, bits at column-row intersections may be permuted. Referring to array 1500 of FIG. 15, the N bits in each row-column intersection are permuted according to a fixed permutation on N elements before encoding to column codewords. As a result of this permutation, the bits that lie in the diagonal intersection go to different locations in the row and column codeword. Thus, the low-weight codewords of the TPC that are caused by a row and column forming the same BCH codewords are eliminated.

When BCH or other cyclic codes are used, care must be taken to choose the permutation for the N bits to ensure that the permutation does not correspond to a some left-shift or right shift operations on the row-column intersection. An example of a permutation that satisfies this condition and is easy to implement in hardware is the 'reversal' permutation that reverses the order of the elements (e.g., elements (1, 2, . . . , N−1, N) are permuted to (N, N−1, . . . , 2, 1)). FIG. 15 shows the row and column codewords for the example in FIG. 6, where the bits in each row-column intersection are permuted according to the reversal permutation before being encoded into the column codewords (e.g., the order of the bits (b0, b1, b2) is reversed to (b2, b1, b0) during encoding into the first column codeword).

At step 508, the data may be decoded and the miscorrections may be detected (e.g., by the decoder) as described above with respect to steps 502, 504, and 506. The three steps 502, 504 and 506 are complimentary, meaning a combination of these steps may be used to lower the probability of miscorrections to the desired regime.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a memory storage configured to store data;
   an encoder configured to encode data into codewords, the data comprising bits arranged in an array of a number of rows and a number of columns, the encoder further configured to compute a first parity of the codewords, the first parity comprising X bits, where X is the number of bits in each of N row-column intersections of the array, each of the X bits of the first parity being computed based on N position-wise bits of the respective N row-column intersections; and
   a decoder configured to
      receive the encoded codewords,
      decode the encoded codewords to generate a decoded result that includes a second parity computed by the decoder, and
      detect whether the decoded result is incorrect by determining whether the first parity computed by the encoder matches the second parity computed by the decoder.

2. The system of claim 1, wherein the encoder is further configured to shorten bits along a diagonal of the array.

3. The system of claim 2, wherein the encoder is further configured to shorten bits on the diagonal of the array by zero-padding the bits along the diagonal.

4. The system of claim 1, wherein the first parity computed by the encoder includes a first N-bit XOR parity, each of the N-bits being computed by taking the XOR of the N position-wise bits of the respective N row-column intersections, and
   wherein the second parity computed by the decoder includes a second N-bit XOR parity of the codewords arranged in the array.

5. The system of claim 4, wherein to detect whether the decoded result is incorrect the decoder determines whether the first XOR parity computed by the encoder matches the second XOR parity computed by the decoder.

6. The system of claim 4, wherein the encoder is further configured to store the computed first XOR parity in the array.

7. The system of claim 1, wherein the encoder is further configured to permute bits at intersections between the number of rows and the number of columns prior to encoding to column codewords.

8. A memory device, comprising:
   an encoder configured to encode data into codewords, the data comprising bits arranged in an array of a number of rows and a number of columns, the encoder further configured to compute a first parity of the codewords, the first parity comprising X bits, where X is the number of bits in each of N row-column intersections of the array, each of the X bits of the first parity being computed based on N position-wise bits of the respective N row-column intersections; and
   a decoder configured to
      receive the encoded codewords,
      decode the encoded codewords to generate a decoded result that includes a second parity computed by the decoder, and
      detect whether the decoded result is correct by determining whether the first parity computed by the encoder matches the second parity computed by the decoder.

9. The memory device of claim 8, wherein the encoder is further configured to shorten bits along a diagonal of the array.

10. The memory device of claim 9, wherein the encoder is further configured to shorten bits by zero-padding the bits along the diagonal.

11. The memory device of claim 8, wherein the first parity computed by the encoder includes a first N-bit XOR parity, each of the N-bits being computed by taking the XOR of the N position-wise bits of the respective N row-column intersections, and
    wherein the second parity computed by the decoder includes a second N-bit XOR parity of the codewords arranged in the array.

12. The memory device of claim 11, wherein to detect whether the decoded result is incorrect the decoder determines whether the first XOR parity computed by the encoder matches the second XOR parity computed by the decoder.

13. The memory device of claim 11, wherein the encoder is further configured to store the computed first XOR parity in the array.

14. The memory device of claim 8, wherein the encoder is further configured to permute bits at intersections between the number of rows and the number of columns prior to encoding to column code words.

15. A method, comprising:
    encoding, with an encoder, data into codewords, the data comprising bits arranged in an array of a number of rows and a number of columns, and computing with the encoder a first parity of the codewords, the first parity comprising X bits, where X is the number of bits in each of N row-column intersections of the array, each of the X bits of the first parity being computed based on N position-wise bits of the respective N row-column intersections;

receiving, with a decoder, the encoded codewords;

decoding, with the decoder, the received codewords to generate a decoded result that includes a second parity computed with the decoder; and detecting, with the decoder, whether the decoded result is incorrect by determining whether the first parity computed by the encoder matches the second parity computed by the decoder.

16. The method of claim 15, further comprising shortening bits along a diagonal of the array.

17. The method of claim 16, wherein the computing the first parity, with the encoder, includes computing a first N-bit XOR parity, each of the N-bits being computed by taking the XOR of the N position-wise bits of the respective N row-column intersections; and the computing the second parity, with the decoder, includes computing a second N-bit XOR parity of the codewords arranged in the array.

18. The method of claim 17, wherein the detecting whether the decoded result is correct, with the decoder, includes determining whether the first XOR parity computed with the encoder matches the second XOR parity computed with the decoder.

19. The method of claim 16, further comprising permuting, with the encoder, bits at intersections between the number of rows and the number of columns.

20. The method of claim 19, wherein the computing the first parity, with the encoder, includes computing a first N-bit XOR parity, each of the N-bits being computed by taking the XOR of the N position-wise bits of the respective N row-column intersections; and the computing the second parity, with the decoder, includes computing a second N-bit XOR parity of the codewords arranged in the array;

wherein the detecting whether the decoded result is incorrect, with the decoder, includes determining whether the first N-bit XOR parity computed with the encoder matches the second N-bit XOR parity computed with the decoder.

* * * * *